United States Patent

Yoshida

[11] Patent Number: 5,844,822
[45] Date of Patent: Dec. 1, 1998

[54] SIMULATION METHOD FOR SEMICONDUCTOR DEVICE

[75] Inventor: Yasuaki Yoshida, Tokyo, Japan

[73] Assignee: Mitsubishi Denki Kabushiki Kaisha, Tokyo, Japan

[21] Appl. No.: 854,544

[22] Filed: May 12, 1997

[30] Foreign Application Priority Data

Nov. 20, 1996 [JP] Japan ................... 8-309125

[51] Int. Cl.$^6$ ............ G06F 17/50; H01S 3/085; H01S 3/103
[52] U.S. Cl. ............ 364/578; 364/488
[58] Field of Search ............ 364/488, 489, 364/578; 257/79, 98; 372/33, 34, 36, 39, 43, 44, 46, 49, 109

[56] References Cited

U.S. PATENT DOCUMENTS

| | | | |
|---|---|---|---|
| 4,432,091 | 2/1984 | Kuroda et al. | 372/45 |
| 4,893,313 | 1/1990 | Hatakoshi et al. | 372/46 |
| 5,119,393 | 6/1992 | Oka et al. | 372/50 |
| 5,177,758 | 1/1993 | Oka et al. | 372/50 |
| 5,260,589 | 11/1993 | Yamauchi et al. | 257/98 |
| 5,444,726 | 8/1995 | Kitamura et al. | 372/36 |
| 5,590,144 | 12/1996 | Kitamura et al. | 372/36 |

FOREIGN PATENT DOCUMENTS 5152234  6/1993  Japan .

OTHER PUBLICATIONS

Ueno et al., "Two–Dimensional Numerical Analysis of Lasing Characteristics for Self–Aligned Structure Semiconductor Lasers", IEEE Journal of Quantum Electronics, vol. 26, No. 6, Jun. 1990, pp. 972–981.
Lastip User's Manual, Version 3.1, 1992–1993, pp. 10–1 through 10–9.

Primary Examiner—Vincent N. Trans
Attorney, Agent, or Firm—Leydig, Voit & Mayer

[57] ABSTRACT

A method for simulating and analyzing two-dimensional current and light distributions of a semiconductor laser including an active layer, a cladding layer, and a light absorbing layer includes obtaining initial values of light distribution and carrier distribution, setting a bias condition, and performing current and light distribution analyses. The calculation of the initial value of the two-dimensional light distribution includes calculating a provisional absorption coefficient of the light absorbing layer from the refractive index of the cladding layer, the refractive index of the light absorbing layer, and the laser light wavelength; obtaining a solution in which the real part of the propagation constant of the wave equation is a maximum, using the provisional absorption coefficient; and repeating the calculation, using a sequential approximation method, until the absorption coefficient in the propagation constant equals the absorption coefficient in the original light absorbing layer. The propagation constant in the active layer is then larger than in a light absorbing region. Thus, the center of the light distribution is located in the active layer and the solution, specifying a laser oscillation mode, can be automatically derived without special judgment criteria.

4 Claims, 8 Drawing Sheets

SIMULATION METHOD FOR SEMICONDUCTOR DEVICE

FIELD OF THE INVENTION

The present invention relates to a method for computer simulation analysis of characteristics, e.g., optical and electrical characteristics, of semiconductor devices such as semiconductor lasers and light waveguides, more particularly, to a simulation method for a semiconductor device which automatically derives a mode having the same light distribution as that in actual devices without special judgment criteria.

BACKGROUND OF THE INVENTION

Two-dimensional device simulation is a tool for calculating optical and electrical characteristics of semiconductor devices such as semiconductor lasers on computer, and this is favorable for accelerating device development.

The use of the two-dimensional device simulator allows prediction of characteristics such as light output power (W) versus current without producing a device itself, leading to semiconductor laser development with high efficiency. In addition, the utilization of the two-dimensional device simulator also allows determination of physical quantities, such as current distribution and light distribution, which cannot be measured. This enhances understanding of these physical phenomena, and is frequently used for failure analysis and designing of semiconductor devices.

Such two-dimensional device simulators are being developed by respective semiconductor laser makers, and ones for general purpose use have been put on the market by software makers.

For example, Ueno et al's "Two-Dimensional Numerical Analysis of Lasing Characteristics for Self-Aligned Structure Semiconductor Lasers", (IEEE J. Quantum Electron., vol. 26, pp 972–981, 1990) shows a representative case of the two-dimensional device simulators developed by semiconductor laser makers.

"LASTIP (Laser Technology Integrated Program)" by Crosslight Software Inc. (the former-Beamtek), Canada, is an example of the two-dimensional device simulators sold by software makers.

Next, a description is given of a conventional simulation method for a semiconductor device by means of such a two-dimensional device simulator.

Figure 2:
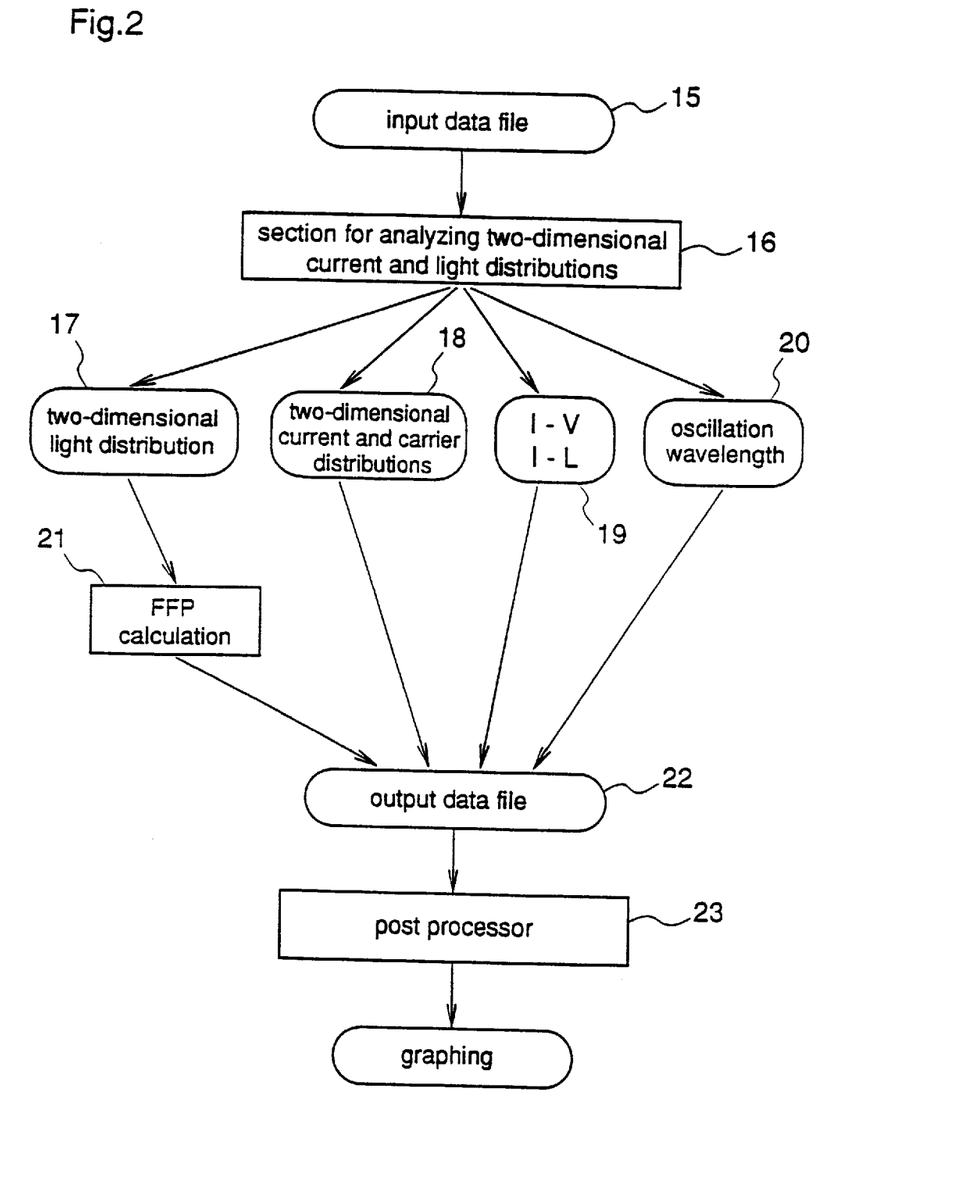
FIG. 2 is a flowchart illustrating overall operation a two-dimensional device simulator.

In the simulation method shown in FIG. 2, first of all, the structure, dimensions, and doping concentrations of semiconductor laser are input as input data to form an input data file 15. Then, the input data, which is output from the input data file 15, is input to a section for analyzing two-dimensional current and light distributions 16, and two-dimensional light distribution (near-field pattern) 17, two-dimensional current distribution and carrier distribution 18, voltage versus current (I-V) and light output power versus current (I-L) 19, and oscillation wavelength 20 are calculated self-consistently and, based on the two-dimensional light distribution 17, an FFP (Far-Field Pattern) 21 is calculated. The calculated results are used to form an output data file 22, which is visualized and graphed using a post processor 23. The analysis of the light and current distributions thus visualized and graphed enables computer analysis of optical and electrical characteristics or the like of the semiconductor laser.

Next, a description is given of the method of analysis performed in the section for analyzing two-dimensional current and light distributions 16.

Figure 3:
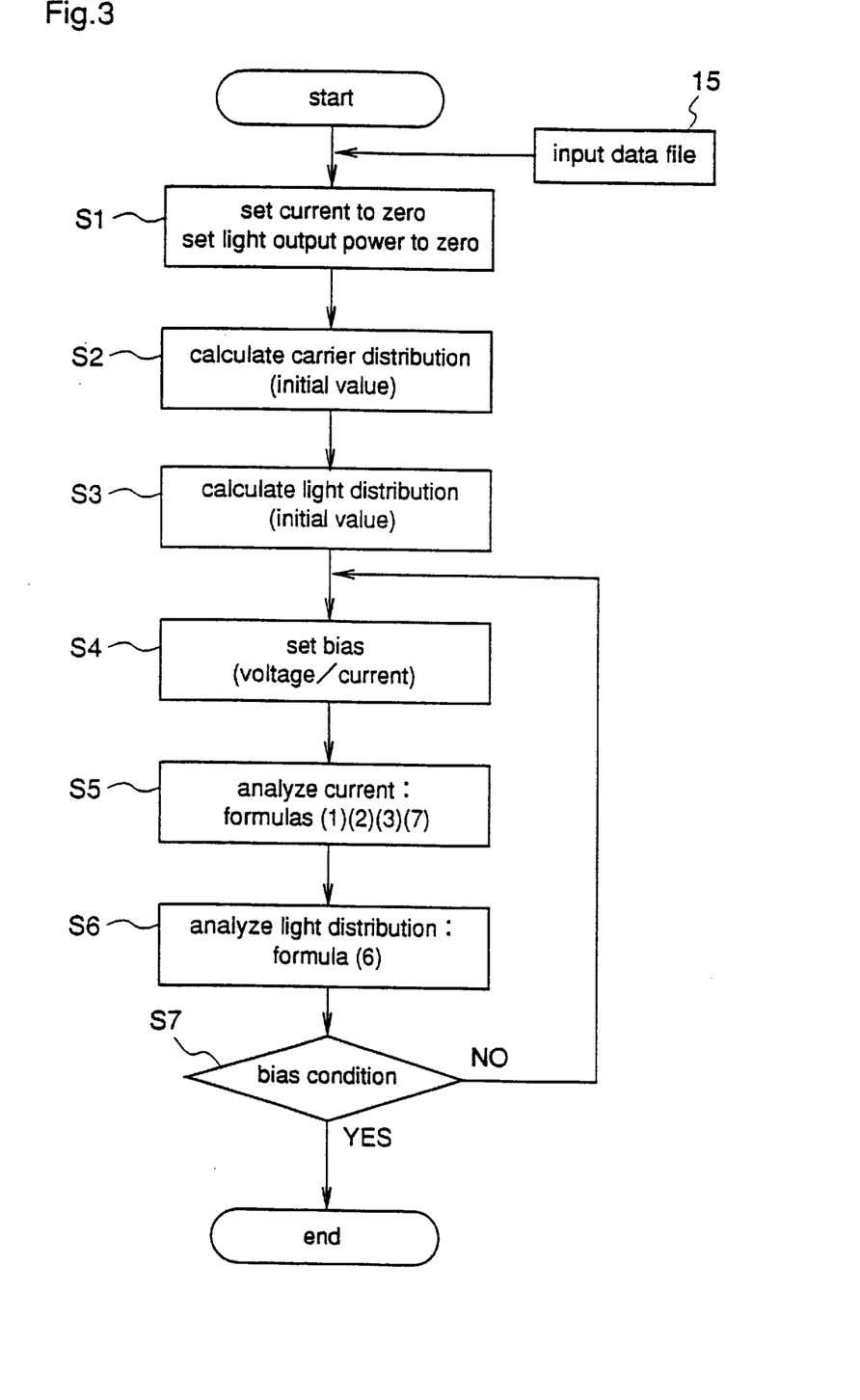
FIG. 3 is a flowchart illustrating a section for analyzing two-dimensional current and light distributions in the two-dimensional device simulator.

FIG. 3 is a flowchart illustrating the analytical procedure at the section for analyzing two-dimensional current and light distributions 16. In the section 16, calculations are performed in accordance with the flowchart shown in FIG. 3.

First of all, the data from the input data file 15 where the structure, dimensions, and doping concentration of the semiconductor laser are input are introduced to step S1 and, in this step, zero bias conditions are established such that current and light output power are set to zero. In step S2, calculation of an initial value of the carrier distribution is performed based on those input data set to the zero bias conditions, and in step S3, calculation of an initial value of the light distribution is performed. In step S4, given bias conditions are set, and current is analyzed in step S5 and light distribution is analyzed in step S6. Subsequently, in step S7, the calculations performed in steps S4–S6 are repeated on the basis of the successive bias conditions. When solutions are obtained for all of the bias conditions, the calculations are ended.

The following formulae are basic equations used in analyzing current in step S5 and analyzing light distribution in step S6.

Initially, potential $\phi$, electron density n, and hole density p are obtained, according to a drift-diffusion model, by the following formulae:

Poisson's equation $$\nabla \cdot (\epsilon \nabla \phi) = -q(p - n + Nd - Na) \tag{1}$$

Formulae from current continuity:

$$1/q \nabla Jn + G - R = 0 \tag{2}$$

$$1/q \nabla Jp + G - R = 0 \tag{3}$$

herein $$Jn = -q\mu_n n \nabla \phi_n \tag{4}$$

$$Jp = -q\mu_p p \nabla \phi_p \tag{5}$$

where $\epsilon$ is the dielectric constant, $\phi$ is the electrostatic potential, q is the elemental electric charge, p is the hole density, n is the electron density, Nd is the n-type impurity concentration, Na is the p-type impurity concentration, in is the electron current density, Jp is the hole current density, G is the electron/hole generation term, R is the electron/hole recombination, $\mu_n$ is the electron mobility, $\mu_p$ is the hole mobility, $\phi_n$ is the quasi-Fermi potential of electrons, $\phi_p$ is the quasi-Fermi potential of holes.

On the other hand, the light distribution E is given by the following wave equation:

$$\nabla^2 E(x, y) + [\{n(x, y)k_0\}^2 - \beta^2] E(x, y) = 0 \tag{6}$$

where $k_0$ is the optical wave number ($2\pi/\lambda$) in vacuum, $\nabla$ is the operator represented by the following formula:

$$\nabla^2 = \partial^2/\partial x^2 + \partial^2/\partial y^2,$$

n is the complex refractive index depending on material constant and carrier concentration, and $\beta$ is the complex propagation constant represented by the following formula:

$$\beta = k_0 \{n_r + i(\alpha_z/2k_0)\},$$

wherein $n_r$ is the real part of a refractive index, i is the complex number, and $\alpha_z$ is the absorption coefficient in the light traveling direction.

The laser oscillation state that is above the threshold value satisfies the following rate equation:

$$dS_m/dt = (v_g g_m - 1/\tau_{pH})S_m + C_m R_{sp} \quad (7)$$

wherein $S_m$ is the light density, $g_m$ is the mode gain, $v_g$ is the speed of light in the semiconductor, $\tau_{PH}$ is the photon life-time. The final term of the formula (7) represents the contribution of spontaneously emitted light to the oscillation mode.

Next, a description is given of problems in a case where an analysis of electrical and optical characteristics of a semiconductor device is actually performed in accordance with the above-described simulation method.

Figure 5:
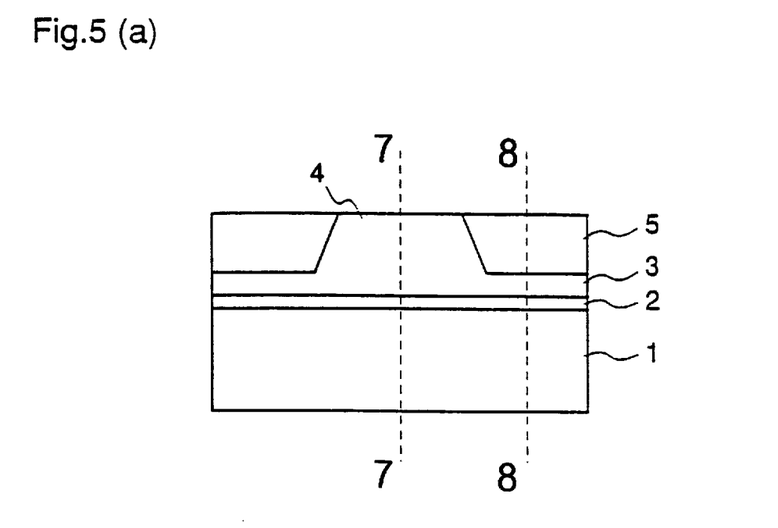
FIGS. 5(a) and 5(b) are schematical views illustrating a structure of an SAS semiconductor laser and its refractive indices and absorption coefficients.

FIG. 5(a) is a diagram illustrating an SAS (self-aligned structure) semiconductor laser whose electrical and optical characteristics are analyzed by the above-described simulation method, and FIG. 5(b) is a diagram illustrating the distributions of the refractive indices and optical absorption coefficients in the SAS semiconductor laser shown in FIG. 5(a).

In the figures, reference numeral 1 is an n-type cladding layer comprising $Al_x Ga_{1-x} As$ (x=0.5), numeral 2 designates a bulk or MQW type active layer, numeral 3 designates a p-type first cladding layer comprising $Al_x Ga_{1-x} As$ (x=0.5), numeral 4 designates a p-type second cladding layer comprising $Al_x Ga_{1-x} As$ (x=0.5), and numeral 5 designates an n-type blocking layer comprising $Al_x Ga_{1-x} As$.

In general, the n-type blocking layer 5 of this SAS semiconductor laser preferably comprises GaAs, that is, $Al_x Ga_{1-x} As$ (x=0.0). As for the profiles of the refractive index and optical absorption coefficient in the SAS type semiconductor laser shown in FIG. 5(a), as shown in FIG. 5(b), the refractive index in the n-type blocking layer 5 is larger than those in the p-type cladding layers 3 and 4, and the optical absorption coefficient in the n-type blocking layer 5 is larger than those in the p-type cladding layers 3 and 4. The wavelength of the laser light from this semiconductor laser is 0.78 μm.

When a region having a high refractive index is present in a region other than the active layer 2 in the semiconductor laser, for example, the n-type blocking layer 5 as in the above semiconductor laser, the following problems occur in the calculation of light distribution, as described in the chapter 10 of the user's manual (version 3.1) for the two-dimensional device simulator, "LASTIP".

Figure 6:
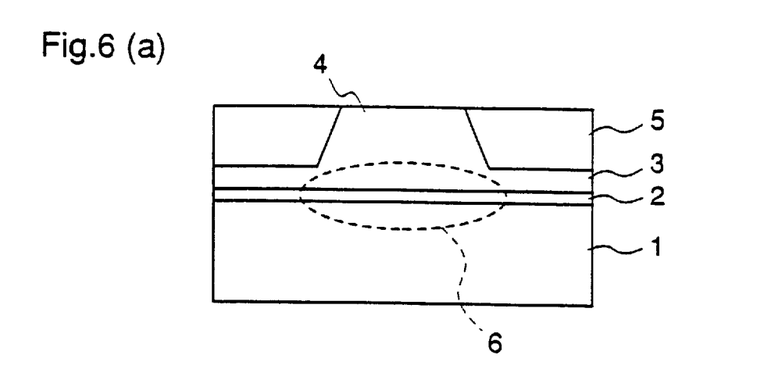
FIGS. 6(a), 6(b), and 6(c) are schematic views for explaining problems of the prior art with reference to the light distribution of an actual device and the light distribution as calculated by the simulator.

FIGS. 6(a) and 6(b) illustrate examples of the light distribution 6 in an actual device, and FIG. 6(c) shows an example of the light distribution 6 obtained as the results of the calculations by the simulation method. The light distribution 6 of the actual device has a mode in which the center of the light distribution 6 is located in a region of the active layer 2 (hereinafter referred to as active layer 2 region) as shown in FIGS. 6(a) and 6(b). On the other hand, the light distribution obtained from the calculation by the simulation method has a mode in which the center of the light distribution is located in the region of the n-type blocking layers 5 (hereinafter referred to as n-type blocking layer 5 region) as shown in FIG. 6(c).

The reason will be described as follows.

Figure 7:
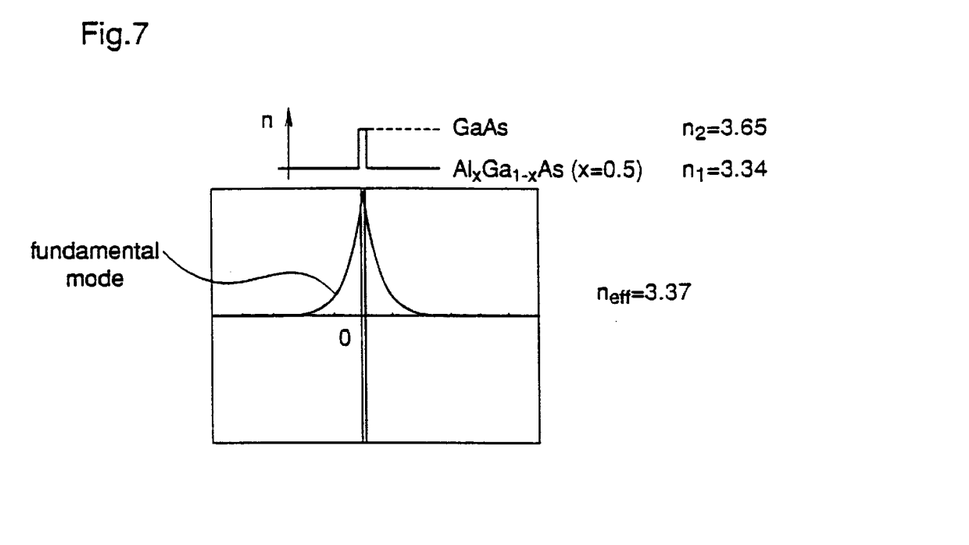
FIG. 7 is a graph illustrating the light distribution of the fundamental mode (propagation mode with the largest propagation constant) of the light waveguide in the 7—7 cross section of the active layer region shown in FIG. 5(a).
Figures 8A, 8B:
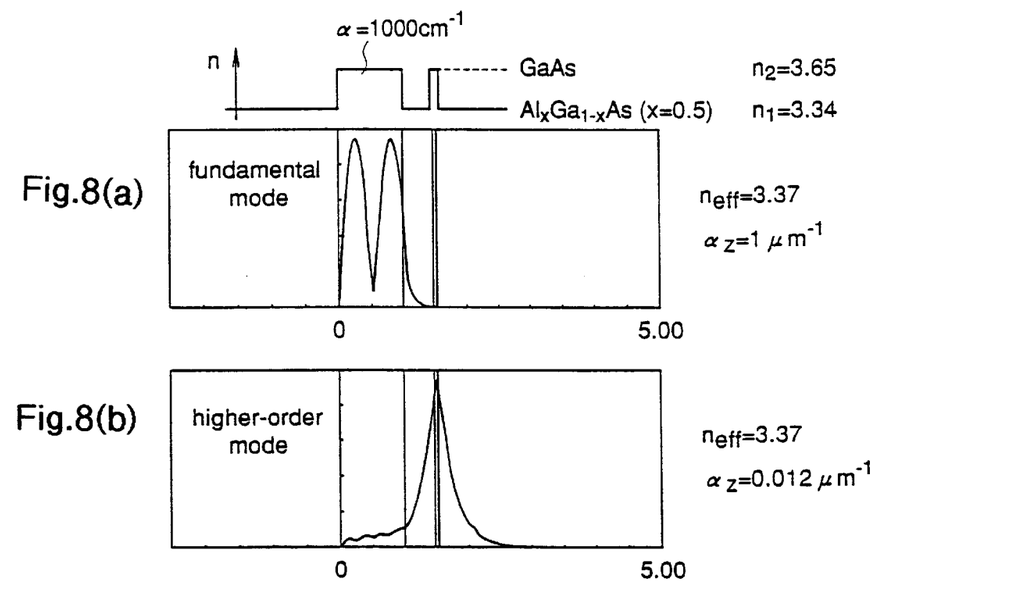
FIGS. 8(a) and 8(b) are graphs showing light distributions in fundamental and higher order modes of the light waveguide in the 8—8 cross section of the n-type blocking layer region shown in FIG. 5(a).

FIG. 7 shows a light distribution of the fundamental (zero-order) mode a inlight waveguide, i.e., the propagation mode in which the real part of the propagation constant β of the wave equation has a maximum, in the cross section taken along line 7—7 of the active layer 2 region shown in FIG. 5(a), and FIGS. 8(a) and 8(b) show light distributions of the fundamental and higher order modes, respectively, of the light waveguide in the cross section taken along line 8—8 of the n-type blocking layer 5 region shown in FIG. 5(a).

In the actual device, since voltages are applied from above and below the active layer 2, a mode is selected in which the center of the light distribution is located in the active layer 2 region so that a mode gain required for laser oscillation is obtained.

On the other hand, in the simulation method, when the wave equation is solved to obtain the light distribution, the propagation constant β is calculated using a so-called equivalent refractive index method that performs calculations assuming that the regions of the same refractive indices have equal refractive indices, and the solution which has the maximum for the real part of the propagation constant β is used as the initial value of the propagation constant β. As a result, in a device such as the SAS semiconductor laser wherein not only the active layer 2 region but the n-type blocking layer 5 have higher refractive indices than the p-type cladding layers 3 and 4, the real part of the propagation constant β is larger in the mode in which the center of the light distribution 6 is located in the n-type blocking layer 5 than in the mode in which the center of the light distribution 6 is located in the active layer 2 region as shown in FIG. 8(a), as represented by the following calculation examples:

$$\beta = K_0 \cdot n_{eff}$$

$$n_{eff} = n_r + i(\alpha_z / 2k_0)$$

where β is the propagation constant, $k_0$ is the optical wave number $(2\pi/\lambda)$ of a wavelength λ in vacuum, $n_r$ is the real part of the refractive index, and $\alpha_z$ is the absorption coefficient in the light traveling direction. From the above relation, $$\beta^2 = (k_0 \cdot n_r)^2 - \alpha_z^2/4 + i(k_0 \cdot n_r \cdot \alpha_z)$$

When $n_1$ is the refractive indices of the p-type cladding layers 3 and 4, $n_2$ is the refractive indices of the n-type blocking layer 5, and the propagation constant β of a solution for which the center of the light distribution is located in the n-type blocking layer 5 region is given by $$Re(\beta[n\ block]^2) = (k_0 \cdot n_2)^2 - \alpha_{GaAs}^2/4 = \{(2\pi/0.78) \times 3.65\}^2 - 1.0^2/4$$
$$= 864.2\ (cm^{-2})$$

On the other hand, the propagation constant β of a solution for which the center of the light distribution is located in the active layer 2 region is given by $$Re(\beta[AR]^2) = (k_0 \cdot n_1)^2 = \{(2\pi/0.78) \times 3.34\}^2 = 723.9\ (cm^{-2})$$

from $$n_r = n_1,\ \alpha = 0$$

As shown in these calculation examples, since the real part of the propagation constant β is larger in the mode in which the center of the light distribution 6 is located in the n-type blocking layer 5 than in the mode in which the center of the light distribution 6 is located in the active layer 2 region as shown in FIG. 8(a), the mode in which the center of the light distribution 6 is located in the n-type blocking layer 5 is selected, and the solution for which the center of the light distribution 6 is located in the active layer 2 region, i.e., the solution in the laser oscillation mode, is not obtained.

In the conventional simulation method, in view of the above problem, the procedure for calculating the initial value of the light distribution in step S3 according to the flowchart shown in FIG. 3 is performed by the following method, to select the mode so that the center of the light distribution is located in the active layer 2 region.

Figure 4:
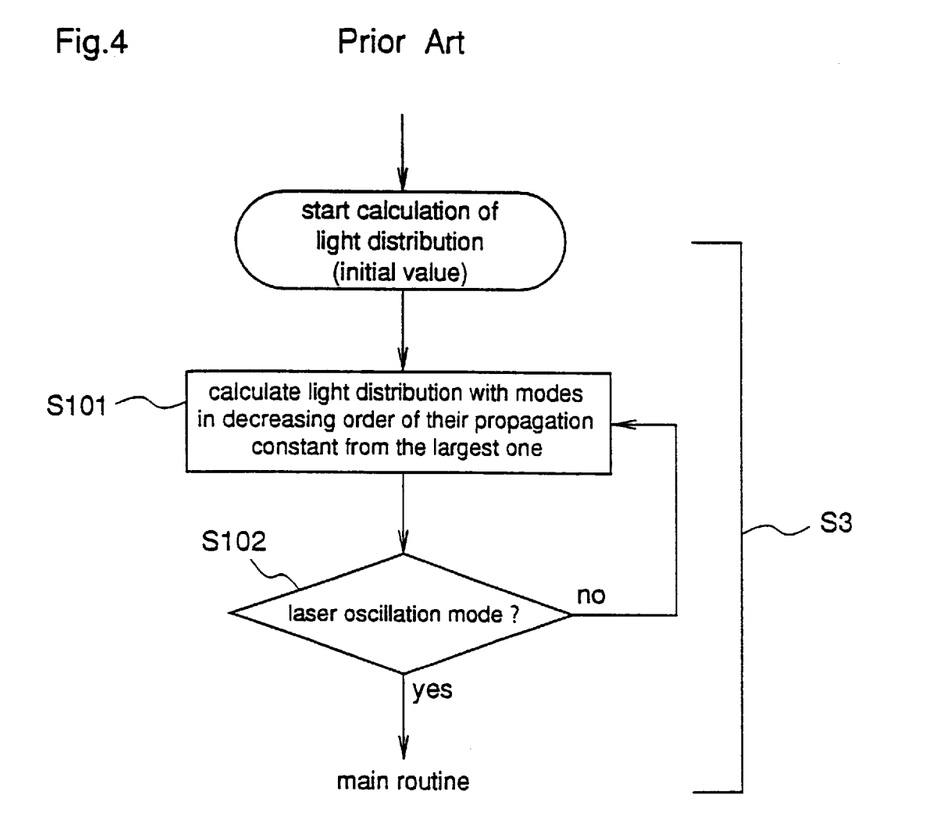
FIG. 4 is a flowchart illustrating conventional process steps for calculating the initial value of light distribution.

To be more specific, in the conventional simulation method, calculation of the initial value of the light distribution in step S3 shown in FIG. 3 is performed by procedure as shown in the flowchart shown in FIG. 4. Initially, in step S101, the mode is the one having the maximum real part of the propagation constant β successive to the one having the smaller real part of the propagation constant, and the position of the center of each light distribution is investigated. In the next step (step S102), the mode in which the center of the light distribution 6 is located in the active layer 2 region is searched to obtain the initial value of the propagation constant β. However, this method is not practical because there are many (several hundreds) solutions for which the center of the light distribution 6 is located in the n-type blocking layer 5.

There is also a calculation method which eliminates the solutions having no relation to the laser oscillation by narrowing the calculation range of the light distribution 6. In this method, however, as the light expands in a range of several micrometers, it is almost impossible to narrow the calculation region without greatly affecting the light distribution.

SUMMARY OF THE INVENTION

It is an object of the present invention to provide a method for simulating operation of a semiconductor device wherein, during analyzing light distribution of the semiconductor device, a mode having a light distribution similar to that of the actual device is automatically derived without special judgment criteria.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from the detailed description.

According to a first aspect of the present invention, in the simulation method for semiconductor device for analyzing two-dimensional current and light distributions of a semiconductor device which includes a semiconductor laser comprising an active layer, a cladding layer, and a light absorbing layer with higher refractive index than the cladding layer, which simulation method comprises obtaining the initial values of the light and carrier distributions, setting a bias condition, and performing the current analysis and the light distribution analysis, the calculation of the initial value of the two-dimensional light distribution includes steps of: calculating a provisional absorption coefficient $\alpha_m$ of the light absorbing layer from the refractive index $n_1$ of the cladding layer 1, the refractive index $n_2$ of the light absorbing layer, and the light wavelength λ, on the basis of the formula:

$$\alpha_m = 2 \times \frac{2\pi}{\lambda} \times \sqrt{n_2^2 - n_1^2}$$

obtaining the solution in which the real part of the propagation constant β in the wave equation has the maximum, using the provisional absorption coefficient $\alpha_m$, the wave equation being $$\nabla^2 E(x, y) + [\{n(x, y)k_0\}^2 - \beta^2]E(x, y) = 0$$

where E is the light distribution, $k_0$ is the wave number $2\pi/\lambda$ of the light with a wavelength in vacuum $\lambda_0$, and ∇ is the operator represented by $$\nabla^2 = \partial^2/\partial x^2 + \partial^2/\partial y^2$$

and n is the complex refractive index depending on material constant and carrier concentration, and β is the complex propagation constant:

$$\beta = k_0\{n_r + i(\alpha_z/2k_0)\}$$

wherein $n_r$ is the real part of a refractive index, i is the complex number, and $\alpha_z$ is the absorption coefficient in the light traveling direction; and repeating calculation for obtaining the solution of the wave equation using sequential approximation method with the solution obtained using the provisional absorption coefficient $\alpha_m$ as the initial value, until the value of the absorption coefficient $\alpha_z$ in the propagation constant β becomes the value in the light absorbing layer of the actual device. Therefore, since the propagation constant in the active layer region is larger than that in the light absorbing layer region, the solution for which the center of the light distribution is located in the active layer region, that is, the solution with the laser oscillation mode, is automatically derived without special judgment criteria. As a result, analysis of optical and electrical characteristics can be performed for a semiconductor device having two-dimensional light distribution similar to that of the actual device.

According to a second aspect of the present invention, the simulation method for semiconductor device according to the first aspect includes obtaining the solution other than the solution in which the real part of the propagation constant β in the wave equation has the maximum. Therefore, it is possible to obtain the solution in which the propagation constant is smaller than the largest one, and utilize the solution for calculation of the light distribution with a higher order mode.

According to a third aspect of the present invention, in the simulation method for semiconductor device for analyzing two-dimensional current and light distributions in a semiconductor device which includes a light waveguide comprising a core layer and a cladding layer with higher refractive index than the core layer, the simulation method comprising obtaining the initial values of the light and carrier distributions, setting a bias condition, and performing the current analysis and the light distribution analysis, the calculation of the initial value of the two-dimensional light distribution includes steps of: calculating the provisional absorption coefficient $\alpha_m$ of the cladding layer from the refractive index $n_1$ of the core layer, the refractive index $n_2$ of the cladding layer, and the light wavelength λ, on the basis of the formula:

$$\alpha_m = 2 \times \frac{2\pi}{\lambda} \times \sqrt{n_2^2 - n_1^2}$$

obtaining the solution in which the real part of the propagation constant β in the wave equation has the maximum, using the provisional absorption coefficient $\alpha_m$, the wave equation being $$\nabla^2 E(x, y) + [\{n(x, y)k_0\}^2 - \beta^2]E(x, y) = 0$$

wherein E is the light distribution, $k_0$ is the wave number $2\pi/\lambda$ of the light with a wavelength in vacuum $\lambda_0$, and ∇ is the operator represented by $$\nabla^2 = \partial^2/\partial x^2 + \partial^2/\partial y^2.$$

and n is the complex refractive index depending on material constant and carrier concentration, and β is the complex propagation constant:

$$\beta=k_0\{n_r+i(\alpha_z/2k_0)\}$$

wherein $n_r$ is the real part of a refractive index, i is the complex number, and $\alpha_z$ is the absorption coefficient in the light traveling direction; and repeating calculation for obtaining the solution of the wave equation using sequential approximation method with the solution obtained using the provisional absorption coefficient $\alpha_m$ as the initial value, until the value of the absorption coefficient $\alpha_z$ in the propagation constant $\beta$ becomes the value in the original cladding layer. Therefore, since the propagation constant in the core layer region is larger than that in the cladding layer region, the solution for which the center of the light distribution is located in the core layer region, that is, the solution in the waveguiding mode, is automatically derived without special judgment criteria. As a result, analysis of optical and electrical characteristics can be performed for a semiconductor device having two-dimensional light distribution similar to that of the actual device.

According to a fourth aspect of the present invention, the simulation method for semiconductor device according to the third aspect includes obtaining the solution other than the solution in which the real part of the propagation constant $\beta$ in the wave equation has the maximum. Therefore, it is possible to obtain the solution in which the propagation constant is smaller than the largest one, and utilize the solution for calculation of the light distribution with a higher order mode.

DETAILED DESCRIPTION OF THE PREFERRED EMBODIMENTS

Figure 1:
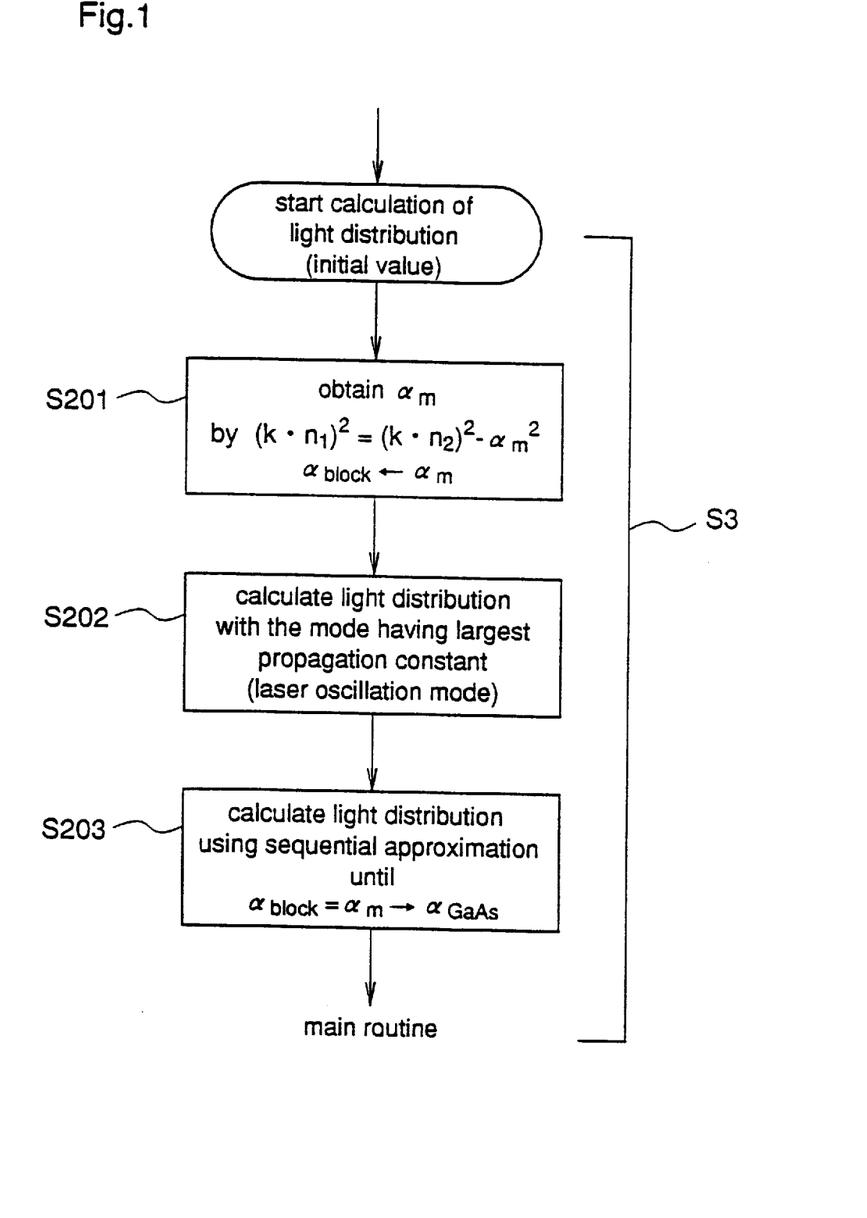
FIG. 1 is a flowchart illustrating process steps for calculating an initial value of light distribution according to a method for simulating semiconductor device operation in accordance with a first embodiment of the present invention.

A description is given of a method for simulating operation of a semiconductor device (a semiconductor laser) in accordance with a first embodiment of the present invention with reference to the flowcharts shown in FIGS. 1 to 3. In the first embodiment, an SAS (self-aligned structure) semiconductor laser shown in FIG. 5(a) is used as a model device for simulation.

The entire structure of the simulation method in accordance with the first embodiment is illustrated according to the flowchart in FIG. 2, as in the prior art. In a section for analyzing two-dimensional current and light distributions 16, a two-dimensional light distribution (near-field pattern) 17, an FFP (far-field pattern) 21, two-dimensional current and carrier distributions 18, voltage versus current and light output power versus current 19, and an oscillation wavelength 20 are calculated self-consistently on the basis of the data from the input data file 15 to which the structure, dimensions, and dopant concentrations of the semiconductor laser has been input. Then, the calculated results are input to the output data file 22, and the data therefrom is visualized and graphed by a post processor 23.

The analyzing procedure in the section for analyzing two-dimensional current and light distributions 16 is in accordance with the flowchart in FIG. 3, as in the prior art. In step S1, the input data from the input data file 15 is set to the zero bias condition, and in step S2, the calculation of the initial value of the carrier distribution is performed, and in step S3, the calculation of the initial value of the light distribution is performed. In step S4, a given bias condition is set, and in step S5, current analysis is performed, and in step S6, light distribution is analyzed. Then, in step S7, the calculations performed in steps S4–S6 are repeated in a successive bias condition. When solutions are obtained in all of the desired bias conditions, the calculations are ended. As the basic equations used in the current analysis in step S5 and the light distribution analysis in step S6, the above formulae (1)–(7) are used as in the prior art.

Next, a description is given of the calculations of the initial value of the light distribution (step S3 in FIG. 3).

In the first embodiment, the calculation of the initial value of the light distribution in step S3 shown in FIG. 3 is performed in the process steps shown in FIG. 1.

In step S201, the initial value (provisional value) $\alpha_m$ of the absorption coefficient $\alpha_{block}$ of the n-type blocking layer 5 is calculated on the basis of the formula:

$$\alpha_m = 2k_0\sqrt{n_2{}^2 - n_1{}^2}$$

For example, when the refractive index $n_1$ of the cladding layers 3 and 4 is 3.34, the refractive index $n_2$ of the blocking layer 5 is 3.65, and the wavelength $\lambda$ of the laser beam is 0.78 $\mu$m, the provisional absorption coefficient $\alpha_m$ is 24 $\mu m^{-1}$.

On the other hand, in the actual device, $$\alpha_{block}=\alpha_{GaAs}=1.0 \ \mu m^{-1} \ (100000 \ cm^{-1})$$

Next, in step 202, using, for example, equivalent refractive index method, the propagation constant $\beta$, $$\beta=k_0\{n_r+i(\alpha_z/2k_0)\}$$

of the wave equation:

$$\nabla^2 E(x, y)+[\{n(x, y)k_0\}^2-\beta^2]E(x, y)=0$$

is calculated, and the solution in which the real part of the propagation constant $\beta$ has a maximum is the solution of the light distribution to be obtained.

Next, in step S203, using the solution obtained in step S202 as the initial value, and gradually decreasing $\alpha_z$ ($\alpha_{block}$) in the propagation constant $\beta$, the calculation for obtaining the solution of the above-described wave equation, i.e., the light distribution E, is continued using a sequential approximation method until $a\alpha_{block}=\alpha_{GaAs}$ (=1.0 $\mu m^{-1}$).

Then, the solution of the light distribution E when $\alpha_{block}=\alpha_{GaAs}$ is made the initial value, and the calculations are ended, returning to the main routine.

In this way, the provisional absorption coefficient $\alpha_m$ in the n-type blocking layer 5 obtained in step S201, is made the initial value of the absorption coefficient $\alpha_{block}$ in the n-type blocking layer 5, the mode in which the real part of the propagation constant $\beta$ has the maximum is the mode in which the center of the light distribution is located in the active layer 2 region, whereby the solution for the laser oscillation mode can be automatically obtained.

A description is given of the reason why the above-described method enables extracting the solution in the laser oscillation mode.

From the relations:

$$\beta = k_0 \cdot n_{eff}$$

$$n_{eff} = n_r + i(\alpha_z/2k_0)$$

where $\beta$ is the propagation constant, $k_0$ is the wave number of the light with a wavelength $\lambda$ in vacuum $2\pi/\lambda$, $n_r$ is the real part of the refractive index, and $\alpha_z$ is the absorption coefficient in the light traveling direction, $$\beta^2 = (k_0 \cdot n_r)^2 - \alpha_z^2/4 + i(k_0 \cdot n_r \cdot \alpha_z)$$

On the other hand, if the solution for which the center of the light distribution is located in the n-type blocking layer 5 exists, the solution in which the real part of the propagation constant $\beta$ has the maximum is given by $$\beta_r[amx]^2 = (k_0 \cdot n_2)^2 - \alpha_m^2/4$$
$$= \{(2\pi/0.78) \times 3.65\}^2 - \alpha_{GaAs}^2/4$$

On the other hand, the propagation constant $\alpha$ of the active layer 2 region is $$\beta_r[AR]^2 = (k_0 \cdot n_1)^2$$
$$= \{(2\pi/0.78) \times 3.34\}^2$$

Thus, the condition that the propagation constant $\alpha$ has the maximum in the active layer 2 region is:
from $$\beta_r[AR]^2 \geq \beta_r[max],$$

$$(k_0 \cdot n_1)^2 \geq (k_0 \cdot n_2)^2 - \alpha_m^2/4$$

Therefore, $$\alpha_m \geq 2k_0 \sqrt{n_2^2 - n_1^2} = 24$$

However, even when the absorption coefficient $\alpha_{block}$ of the n type blocking layer 5 is made the provisional value of 24 $\mu m^{-1}$ from the original value of 1 $\mu m^{-1}$, the light distribution itself is not greatly affected. Therefore, desired light distribution can be obtained through the above process steps, step S202 and step S203.

Thus, in the simulation method in accordance with the first embodiment, the calculation of the initial value of the two-dimensional light distribution includes steps of: calculating the provisional absorption coefficient $\alpha_m$ in the n-type blocking layer 5 from the refractive index $n_1$ of the p-type cladding layers 3 and 4, the refractive index $n_2$ of the n-type blocking layer 5, and the wavelength $\lambda$ of the light (step S201); obtaining the solution in which the real part of the propagation constant $\beta$ in the wave equation has a maximum, using the provisional absorption coefficient $\alpha_m$ (step S202); and repeating the calculation for obtaining the solution of the wave equation using a sequential appropriation method, with the solution obtained utilizing the provisional absorption coefficient $\alpha_m$ as the initial value, until the value of the absorption coefficient $\alpha_z$ in the propagation constant $\alpha$ becomes the value of the absorption coefficient $\alpha_{GaAs}$ of the original n-type blocking layer 5 region (step S203). Therefore, the propagation constant $\beta$ in the active layer 2 region is larger than that in the n-type blocking layer 5 region, and the solution for which the center of the light distribution is located in the active layer 2 region, that is, the solution with the laser oscillation mode, is automatically derived without special judgment criteria. As a result, analysis of optical and electrical characteristics of a semiconductor device which has a two-dimensional light distribution similar to that of the actual device can be performed.

While in the first embodiment the n-type blocking layer 5 comprises GaAs, the simulation method for a semiconductor device according to the present invention is not limited to application to a semiconductor laser comprising an AlGaAs blocking layer having a higher refractive index than those of the cladding layers 3 and 4 and the semiconductor laser of AlGaAs series material but is applicable to the calculation of the light distribution for a semiconductor laser where the refractive index of the blocking layer region is higher than that of the active layer region, such as a laser comprising InGaP series materials.

Figure 10:
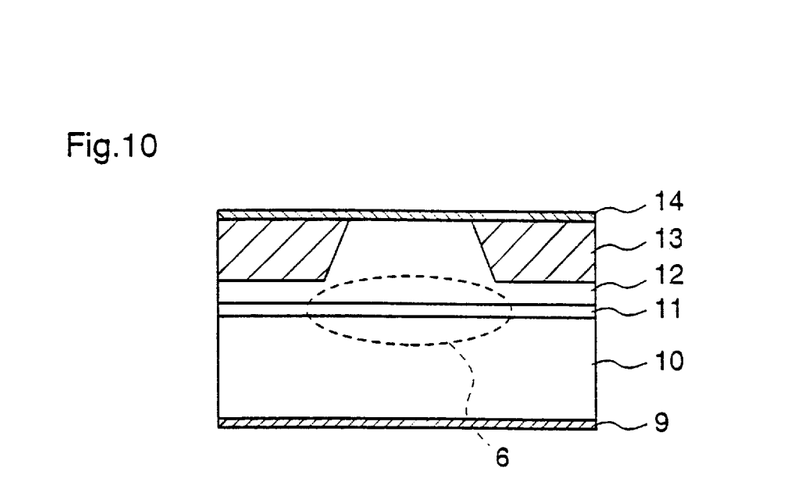
FIG. 10 is a schematical view illustrating a semiconductor device to which simulation methods for semiconductor devices according to the other embodiments of the present invention is applied.

Furthermore, the simulation method according to the present invention is also applicable in calculating the influence on the light distribution of an ESL (etch stopping layer) in the semiconductor laser which has the ESL layer between a cladding layer and a blocking layer, the influence on the light distribution by a GaAs substrate and a GaAs cap layer in the ridge-type semiconductor laser, and the influence on the light distribution by a GaAs substrate and a GaAs cap layer of the effective-refractive-index guide type semiconductor laser shown in FIG. 10. In FIG. 10, reference numeral 9 designates a GaAs substrate, numeral 10 designates an AlGaAs cladding layer, numeral 11 designates an active layer, numeral 12 designates an AlGaAs cladding layer, numeral 13 designates an AlGaAs blocking layer, and numeral 14 designates a GaAs cap layer. In calculating the influence on the light distribution of the GaAs substrate and the GaAs cap layer in the effective-refractive-index guide type semiconductor laser, the simulation is performed setting the provisional absorption coefficients $\alpha_m$ in the GaAs substrate 9 and the GaAs cap layer 14.

Embodiment 2

A description is given of a method of simulating a semiconductor laser (a light waveguide) in accordance with a second embodiment of the present invention.

Figure 9:
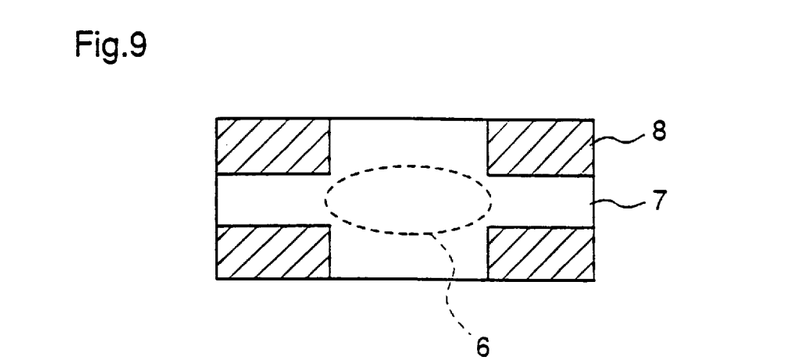
FIG. 9 is a schematical view illustrating a light waveguide to which a simulation method for semiconductor device according to a second embodiment of the present invention is applied.

While in the first embodiment the simulation method is applied to a semiconductor laser, the simulation method in accordance with the second embodiment is used for calculation of the light distribution in the light waveguide as shown in FIG. 9. In the figure, reference numeral 7 designates a core layer, numeral 8 designates a cladding layer having a higher refractive index and a larger optical absorption coefficient than the core layer 7.

The process steps of the simulation method according to the second embodiment are in accordance with the flowcharts shown in FIGS. 1 to 3, as in the case of the first embodiment. In this embodiment, however, in step S201 shown in the flowchart of FIG. 1, the provisional absorption coefficient $\alpha_m$ of the cladding layer 8 is obtained with the refractive index of the core layer 7 being $n_1$, the refractive index of the cladding layer 8 being $n_2$, and the wavelength of the light guided being $\lambda$.

According to the simulation method of second embodiment, the calculation of the initial value of the two-dimensional light distribution includes steps of: calculating the provisional absorption coefficient $\alpha_m$ of the cladding layer 8 from the refractive index $n_1$ of the core layer 7, the refractive index $n_2$ of the cladding layer 8, and the light wavelength $\lambda$ (step S201); obtaining the solution in which the real part of the propagation constant $\beta$ in the wave equation has a maximum, using the provisional absorption coefficient $\alpha_m$ (step S202); and repeating the calculation for obtaining the solution of the wave equation using a sequential approximation method, with the above solution obtained using the provisional absorption coefficient $\alpha_m$ as the initial value, until the value of the absorption coefficient $\alpha_z$ in the propagation constant $\beta$ becomes the value of the absorption coefficient $\alpha_{GaAs}$ in the original cladding layer 8. Therefore, the propagation constant $\beta$ in the cladding layer 8 region is larger than that in the core layer 7 region, and the solution for which the center of the light distribution is located in the core layer 7, that is, the solution in the wave guiding mode is automatically derived without special judgment criteria. As a result, analysis of optical and electrical characteristics can be performed for a light waveguide which has two-dimensional light distribution similar to that of an actual device.

Embodiment 3

A method for simulating a semiconductor device in accordance with a third embodiment does not perform a simulation like the first and second embodiments in that the light distribution comprises one fundamental mode as shown in FIG. 6(a), but performs simulation for a light distribution in plural higher order modes.

In other words, the method according to the third embodiment is the one which obtains not the solution in which the real part of the propagation constant $\beta$ has a maximum but the solution in which the real part of the propagation constant $\beta$ has a value smaller than the maximum, for example, the second largest or third largest value, in step 202 shown in FIG. 1. The simulation steps, except this step, are performed in the same manner as those of the first and second embodiments.

As described above, in the simulation method for semiconductor device according to the third embodiment, after obtaining the provisional absorption coefficient $\alpha_m$ in the absorption layer, using this provisional absorption coefficient $\alpha_m$, the solution in which the real part of the propagation constant $\beta$ has a value smaller than the maximum value is obtained, and the wave equation is solved using this solution. As a result, this simulation can be applied to the simulation for light distribution comprising plural higher order modes (for example, the case shown in FIG. 6(b)).

What is claimed is:

1. A method for simulating operation of a semiconductor device by analyzing two-dimensional current and light distributions of a semiconductor laser including an active layer, a cladding layer, and a light absorbing layer with a higher refractive index than the cladding layer, the simulation method comprising:

obtaining initial values of light distribution and carrier distribution;

setting a bias condition; and analyzing current and light distributions, wherein calculation of the initial value of the two-dimensional light distribution includes:

calculating a provisional absorption coefficient $\alpha_m$ of the light absorbing layer from a refractive index $n_1$ of the cladding layer, a refractive index $n_2$ of the light absorbing layer, and a light wavelength $\lambda$ from $$\alpha_m = 2 \times \frac{2\pi}{\lambda} \times \sqrt{n_2^2 - n_1^2}$$

obtaining a solution in which a real part of the propagation constant $\beta$ of the wave equation has a maximum, the equation being $$\nabla^2 E(x, y) + [\{n(x, y)k_0\}^2 - \beta^2] E(x, y) = 0$$

where E is the light distribution, $k_0$ is the wave number $2\pi/\lambda$ of light with a wavelength $\lambda_0$ in vacuum, and $\nabla$ is the operator represented by $$\nabla^2 = \partial^2/\partial x^2 + \partial^2/\partial y^2,$$

n is the complex refractive index depending on material constants and carrier concentration, and $\beta$ is the complex propagation constant:

$$\beta = k_0\{n_r + i(\alpha_z/2k_0)\},$$

wherein $n_r$ is the real part of a refractive index, i is the complex number, and $\alpha_z$ is the absorption coefficient in the light traveling direction, using the provisional absorption coefficient $\alpha_m$; and repeating the calculation to obtain a solution of the wave equation utilizing a sequential approximation, with the solution obtained using the provisional absorption coefficient $\alpha_m$ as the initial value, until the value of the absorption coefficient $\alpha_z$ in the propagation constant $\beta$ becomes the value in the original light absorbing layer.

2. The method for simulating a semiconductor device as defined in claim 1 including obtaining a solution other than the solution in which the real part of the propagation constant $\beta$ in the wave equation is a maximum.

3. A method for simulating operation of a semiconductor device by analyzing two-dimensional current and light distributions of a semiconductor device comprising a light waveguide including a core layer, and a cladding layer with a higher refractive index than the core layer, the simulation method comprising:

obtaining initial values of light distribution and carrier distribution;

setting a bias condition; and analyzing current and light distributions, wherein calculation of the initial value of the two-dimensional light distribution includes:

calculating a provisional absorption coefficient $\alpha_m$ of the cladding layer from a refractive index $n_1$ of the core layer, the refractive index $n_2$ of the cladding layer, and a light wavelength $\lambda$ from $$\alpha_m = 2 \times \frac{2\pi}{\lambda} \times \sqrt{n_2^2 - n_1^2}$$

obtaining a solution in which a real part of the propagation constant $\beta$ of the wave equation has a maximum, the equation being $$\nabla^2 E(x, y) + [\{n(x, y)k_0\}^2 - \beta^2] E(x, y) = 0$$

where E is the light distribution, $k_0$ is the wave number $2\pi/\lambda$ of light with a wavelength $\lambda$ in vacuum and $\nabla$ is the operator represented by $$\nabla^2 = \partial^2/\partial x^2 + \partial^2/\partial y^2,$$

n is the complex refractive index depending on material constants and carrier concentration, and $\beta$ is the complex propagation constant:

$$\beta = k_0\{n_r + i(\alpha_z/2k_0)\},$$

wherein $n_r$ is the real part of a refractive index, i is the complex number, and $\alpha_z$ is the absorption coefficient in the light traveling direction, using the provisional absorption coefficient $\alpha_m$; and repeating the calculation to obtain a solution of the wave equation utilizing a sequential approximation with the solution obtained using the provisional absorption coefficient $\alpha_m$ as the initial value, until the value of the absorption coefficient $\alpha_z$ in the propagation constant $\beta$ becomes the value in the original cladding layer.

4. The method for simulating a semiconductor device as defined in claim 3 including obtaining a solution other than the solution in which the real part of the propagation constant $\beta$ in the wave equation is a maximum.

\* \* \* \* \*

UNITED STATES PATENT AND TRADEMARK OFFICE
CERTIFICATE OF CORRECTION

PATENT NO. : 5,844,822
DATED : December 1, 1998
INVENTOR(S) : Yoshida

It is certified that error appears in the above-identified patent and that said Letters Patent is hereby corrected as shown below:

Column 12, Line 30, change "$a_2$" to --$a_z$--;

Line 37, change "$a_2$" to --$a_z$--;

Column 14, Line 4, after "approximation"

insert --,--.

Signed and Sealed this

Second Day of March, 1999

Attest:

Q. TODD DICKINSON

*Attesting Officer*  *Acting Commissioner of Patents and Trademarks*